United States Patent [19]
Tait

[11] 4,278,932
[45] Jul. 14, 1981

[54] A.C. BRIDGES

[76] Inventor: David A. G. Tait, 34 Mount St., Dorking, Surrey, England

[21] Appl. No.: 55,171

[22] Filed: Jul. 6, 1979

[30] Foreign Application Priority Data

Jul. 11, 1978 [GB] United Kingdom ............... 29445/78

[51] Int. Cl.³ ..................... G01R 27/00; G01R 27/26; G01R 27/02
[52] U.S. Cl. .................................. 324/57 R; 324/59; 324/60 C; 324/62; 324/DIG. 1
[58] Field of Search ................. 324/57 R, DIG. 1, 62, 324/59, 60 C

[56] References Cited
U.S. PATENT DOCUMENTS 2,968,180  1/1961  Schafer .............................. 324/57 R Primary Examiner—Ernest F. Karlsen
Attorney, Agent, or Firm—Roylance, Abrams, Berdo & Farley

[57] ABSTRACT

An a.c. bridge has a first arm with standard resistance, a second arm with a standard reactance element, a third arm having terminals for connection to an unknown impedance, and a fourth arm comprising a resistive circuit having first and second variable resistive elements. An a.c. supply voltage is coupled between the junction of the first arm with the second arm and the junction of the third arm with the fourth arm. First and second phase-sensitive rectifiers are coupled between the junction of the first arm with the third arm and a variable tap on the second resistive element in the fourth arm. The first rectifier is synchronized to a first a.c. reference signal in phase quadrature with the voltage across the unknown impedance, and the second rectifier is synchronized to a second a.c. reference signal in-phase with the voltage across the unknown impedance. Indicators are coupled to the outputs of the rectifiers for indicating the senses of their output signals. The first resistive element can be adjusted until the phase difference between the unbalance signal at the input of the first rectifier and the first a.c. reference signal is at a predetermined value and the second resistive element is subsequently input of the second rectifier and the second a.c. reference signal is at a predetermined value without affecting the phase relation between the signal at the input of the first rectifier and the first a.c. reference signal to balance the bridge.

13 Claims, 1 Drawing Figure

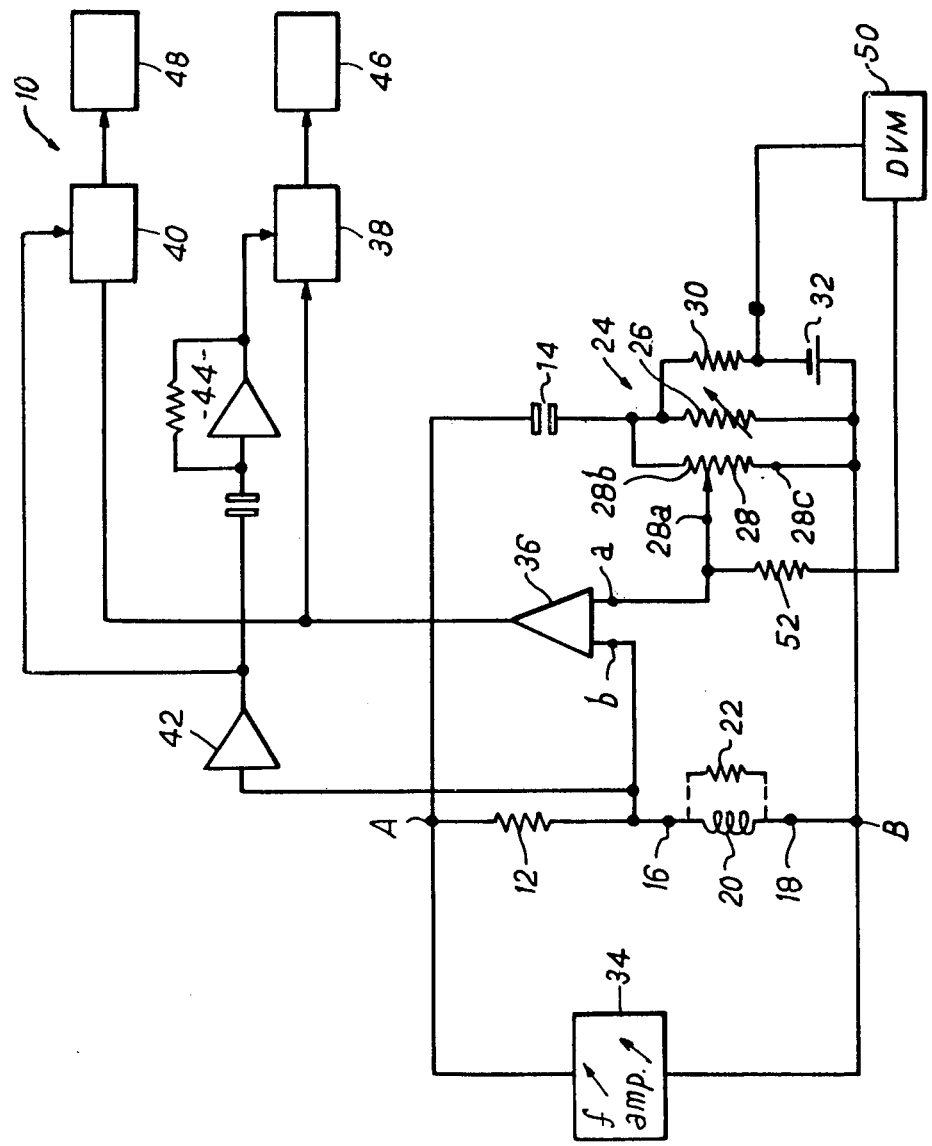

A.C. BRIDGES

BACKGROUND OF THE INVENTION

This invention relates to a.c. bridges for measuring the value of an electrical component having a reactive component, such as an inductor or capacitor.

DISCUSSION OF THE PRIOR ART

Four-arm a.c. bridges in which a reactive component is connected in one arm of the bridge and the bridge is then balanced by adjustment of the value of one or more component in another arm or other arms of the bridge are well known.

Reactive components such as inductors have, of course, a complex impedance comprising a primary component, that is inductance or capacitance as the case may be and a secondary, or impurity, component, that is resistance and the secondary component may be expressed as series resistance or parallel resistance.

One such bridge is the Maxwell bridge in which an unknown inductance in one arm is balanced against a known value of capacitance in another arm, the other arms being provided with resistors, one of which may be variable to select the measurement range and the other of which is variable to effect balance. The balance equations for such a bridge are well known. The finite loss angle of an unknown inductor can be balanced by adjustment of a resistance in shunt with the capacitor, as in a Hay bridge, or in series with the capacitor, as in the Owen bridge.

One of the problems of such bridges when measuring an electrical component having a complex impedance is that the two resistors have to be adjusted successively, first to balance the primary component, the inductive or capacitive reactance, to a first approximation, then to balance the secondary resistive component to a first approximation, and these steps have to be repeated until the bridge is balanced.

It is an object of the invention to provide an a.c. bridge suitable for use with an electrical component having a complex impedance in which the bridge can be substantially balanced by two adjustments of the balancing resistors, after adjusting the value of a range-determining component if required.

SUMMARY OF THE INVENTION

According to the invention there is provided an a.c. bridge comprising first and second arms comprising a standard resistance and a standard reactance element respectively, a third arm having terminals for connection to an unknown impedance, and a fourth arm comprising a resistive circuit having a first variable resistive element, means for coupling an a.c. bridge supply voltage between the junction of the first arm with the second arm and the junction of the third arm with the fourth arm, first and second phase-sensitive rectifiers coupled between the junction of the first arm with the third arm and a variable tap on a second resistive element in the fourth arm whereby part of at least the second resistive element can constitute part of the said second arm, the first phase-sensitive rectifier being synchronised, in operation, to a first a.c. reference signal having a first predetermined phase relation with the voltage developed across the unknown impedance, and the second phase sensitive rectifier being synchronised in operation, to a second a.c. reference signal having a second predetermined phase relation with the voltage developed across the unknown impedance, indicating means coupled to the outputs of the phase-sensitive rectifiers for indicating the sense of their output signal levels, means for adjusting the magnitude of the first said resistive element until the phase difference between the unbalance signal at the input of the first phase sensitive rectifier and the first a.c. reference signal is at a predetermined value and means for subsequently adjusting the tap on the said second resistive element until the phase difference between the signal at the input of the second phase sensitive rectifier and the second a.c. reference signal is at a predetermined value while maintaining the phase relation between the signal at the input of the first phase sensitive rectifier and the first a.c. reference signal substantially constant to balance the bridge.

Preferably, the first and second resistive elements are arranged in parallel in the fourth arm.

The bridge may include means for coupling it to measuring means for determining the reactance of said unknown impedance.

The measuring means may, in addition, be arranged to determine the resistive component of the unknown impedance.

The fourth arm of the bridge may be coupled to a source of a d.c. reference voltage to provide a d.c. current through the first and second resistive elements and the measuring means can be a d.c. responsive device such as an analogue to digital converter or a digital voltmeter.

The first a.c. reference signal may be a voltage in quadrature with the voltage developed, in operation, across the unknown impedance and the first said resistance element adjusted for minimum phase difference as indicated by a minimum value at the output of the first phase sensitive rectifier.

The second a.c. reference signal may be in-phase with the voltage developed, in operation, across the unknown impedance and the second resistive element is adjusted until the amplitude of the unbalance signal at the input of the second phase sensitive rectifier is at a minimum value as indicated by a minimum value at the output of the second phase sensitive rectifier.

Preferably the first and second resistive elements are continuously variable elements and their d.c. resistance values are substantially equal to their a.c. resistance value at the operational frequencies of the a.c. bridge supply.

The second resistive element may be a potential divider coupled in parallel with the first resistive element and the phase-sensitive rectifiers are arranged with one of their inputs coupled to the variable resistance tap on the second resistive element.

The standard reactance element is preferably chosen to have a reactance which is equal to or less than the lowest resistance of the resistive circuit at the frequency of the a.c. bridge supply.

The standard resistance may be variable, such as in decade steps, to facilitate selection of an appropriate measuring range for the bridge.

Means may be provided for disconnecting the resistive circuit from the fourth arm of the bridge and substituting a resistor having a value substantially equal to the maximum value thereof while setting the value of the standard resistor to a selected value.

DESCRIPTION OF THE DRAWINGS

The invention will now be described by way of example with reference to the accompanying drawing, which shows a simplified block schematic diagram of an a.c. bridge according to the invention for determining the inductance of an impedance element.

DETAILED DESCRIPTION OF THE INVENTION

Referring to the drawing there is shown an a.c. bridge 10 having first and second arms including a standard resistor 12 and a standard capacitance 14 respectively. A third arm of the bridge has terminals 16, 18 such as a Kelvin connector, for receiving an inductor 20 whose inductance is to be determined. The inductor 20 will have a complex impedance, the secondary component of which is indicated as shunt resistance 22. The fourth arm of the bridge 10 is provided with a resistive circuit 24 comprising a variable resistance element 26, a potential divider 28 in parallel with resistor 26 and a series circuit of a resistor 30 and a source 32 of a d.c. reference voltage also in parallel with resistor 26. The source 32 is provided to supply a d.c. current through resistors 26 and 28 to facilitate measurement of the resistances thereof.

A source 34 of an a.c. bridge supply voltage including means for varying the frequency and amplitude of the voltage is coupled between the junction of resistor 12 with capacitor 14 and the junction of terminal 18 with resistors 26, 28 and battery 32. A null amplifier 36 has its inputs coupled to the junction of resistor 12 with terminal 16 and to the variable tap 28a of potential divider 28. The output of null amplifier 36 is coupled to the inputs of first and second phase-sensitive rectifiers 38 and 40 respectively. The a.c. reference inputs for the rectifiers 38, 40 are derived from the voltage developed across the unknown inductor 20 by way of a high input impedance buffer amplifier 42. The reference input to rectifier 38 is coupled through a 90° phase change circuit 44 so that it is in quadrature with the voltage developed across inductor 20 and the reference input to rectifier 40 is supplied direct so that it is in phase with the voltage developed across the inductor 20. The outputs of rectifiers 38, 40 are coupled to indicators 46, 48 respectively which are arranged to indicate the sense and magnitude of the outputs of their associated rectifiers.

A digital voltmeter 50 is provided to measure the magnitudes of d.c. voltages at selected points in the a.c. bridge circuit.

In a conventional four-arm bridge such as a Maxwell bridge, balance would be obtained for a pure inductance by adjustment of the value of the resistance in the fourth arm of the bridge. However, the impedance of the inductor will include resistance, as a secondary parameter, which may be expressed as a series or a parallel resistance and this secondary parameter also has to be balanced, usually by introducing a resistor in parallel or series respectively with the standard capacitor. Balance of the bridge is then achieved by a series of alternate adjustments of the values of the resistors in the fourth and second arms until they ultimately converge at a bridge-balanced condition. Clearly this can be time consuming and tedious.

In the bridge 10, the value C of the capacitor 14 is preferably selected to have a value such that its reactance at the bridge supply frequency is equal to or less than the lowest resistance of the fourth arm including resistors 26, 28 and 30. The standard resistor 12 is preferably variable, in decade steps say, and its value N is adjusted to the appropriate range.

The bridge 10 uses phase sensitive rectifiers 38 and 40 having their reference inputs related to the phase of the voltage developed across inductor 20 which facilitates precise adjustment and it is found that the bridge can be balanced in two steps; adjustment of the value of resistor 26 until the phase difference between the voltage across the resistor 26 and inductor 20 is zero, indicated by a minimum or zero output from quadrature rectifier 38 and then adjustment of the tap 28a of the potential divider 28 until the magnitude of the fraction of the voltage across resistor 26, that is the voltage applied to input 36a of amplifier 36, is equal to the magnitude of the voltage across the inductor 20 applied to input 36b. These two adjustments are independent of each other which facilitates rapid balance of the bridge and is practicable for an automatically-balanced or a manually-balanced bridge.

It should be noted, however, that unlike many bridges at balance the values of the inductance and the resistance of the inductor 20 are not simply dependent upon the values of the resistor 26 and the fraction of the resistor 28 tapped off by the slider 28a respectively but are a function of the two resistance values. The values of the inductance and resistance of inductor 20 can be determined quite simply by the use of the digital voltmeter 50 arranged to measure certain d.c. voltages in the bridge circuit. The d.c. source 32, which may be a separate source or the internal reference source of the voltmeter 50, provides a d.c. current through resistors 26 and 28 and the resistor 30 and a resistor 52 connected in the input leads to the voltmeter are of high value to reduce to a negligible amount any loading effect of the voltmeter on the bridge.

At balance, the a.c. relationships of the bridge are $$L_p = NCTk$$

$$L_p/R_p = CT(1-k)$$

$$R_p = N \cdot k/(1-k)$$

where
$L_p$ = inductance of inductor 20
$R_p$ = equivalent parallel resistance 22 of inductor 20
$N$ = resistance of resistor 12
$C$ = capacitance of capacitor 14
$T$ = resistance of resistors 26 and 28 in parallel
$k$ = the fraction of the resistance of resistor 28 between points 28a and 28c and the d.c. relationships are:

$$T = A \cdot V_2/V_1$$

$$k = V_3/V_2$$

$$kT = A \cdot V_3/V_1$$

$$(1-k)T = A \cdot (V_2 - V_3)/V_1$$

where
$A$ = the value of resistor 30
$V_1$ = the d.c. voltage at the junction of the source 32 with resistor 30
$V_2$ = the d.c. voltage across resistor 26

$V_3$ = the d.c. voltage between points 28a and 28c of the potential divider.

From the d.c. relationships:

$$L_p = NCA \cdot V_3/V_1$$

$$L_p/R_p = CA \cdot (V_2-V_3)/V_1$$

$$R_p = N \cdot V_3/(V_2-V_3)$$

As N, C and A are known, calculation of $L_p$ and $R_p$ can be readily obtained by measurement of the values of $V_1$, $V_2$ and $V_3$, three simple d.c. measurements after two comparatively simple adjustments of resistors 26 and 28. As aforementioned, the d.c. resistances of resistors 26 and 28 should be substantially equal to their a.c. resistances at the frequency of the bridge a.c. supply voltage.

It will be understood that the combination of resistive elements 26, 28 in the fourth arm of the bridge forms a network which connects the bridge into what is sometimes described as a six-arm bridge but which can be regarded as a means of transferring a fraction of the resistance from the fourth arm into the second arm.

Various modifications and additions can, of course, be made to the simple circuit described. For example, in order to avoid the need to set resistor 26 and tap 28a of resistor 28 to their maximum values when selecting the appropriate range, a switch could be provided to switch out the said two resistors and substitute a single resistor equal to the maximum value of the resistance of the third arm of the bridge while selecting the value N of resistor 12 and then to switch out the single resistor and re-instate resistors 26 and 28 prior to their adjustment.

As well as being the usual type of variable resistor, the resistor 26 could be a thermistor or light-responsive resistor or the like.

Furthermore, while it is preferred to connect the resistor 28 in parallel with the resistor 26, it is possible to couple it in shunt with the standard capacitor 14. This would give balance in series terms, such that $$L_s = CT(N+R_s) \text{ and}$$

$$R_s = N \cdot (1-k)/k$$

$$R_s = N \cdot (V_2-V_3)/V_3$$

where
$L_s$ = inductance of inductor 20
$R_s$ = equivalent series resistance of inductor 20,
provided that the resistance of the shunt resistor 28 is very much larger than the reactance of the standard capacitor 14, for example $R_s \simeq 100\ X_c$.

I claim:

1. An a.c. bridge comprising
a first arm including an element having a standard resistance;
a second arm including an element having a standard reactance, one end of said second arm being connected to one end of said first arm;
a third arm having terminals for connection to an unknown impedance, one end of said third arm being connected to the other end of said first arm;
a fourth arm comprising a resistive circuit including first and second variable resistance elements, said fourth arm being connected between the other ends of said second and third arms, said second variable resistance having a movable tap;
an a.c. voltage source;
means for connecting one terminal of said source to the junction between said first and second arms and the other terminal of said source to the junction between said third and fourth arms;
first and second phase-sensitive rectifier circuits each having an input terminal and a reference signal terminal;
means for coupling an unbalance signal from the junction between said first and third arms and said movable tap of said second variable resistance to the input of each of said rectifier circuits;
circuit means for supplying a first a.c. reference signal having a predetermined phase relation with the voltage developed across the unknown impedance to said reference input terminal of said first rectifier circuit to synchronize said rectifier circuit;
circuit means for supplying a second a.c. reference signal having a second predetermined phase relation with the voltage developed across the unknown impedance to synchronize said rectifier circuit; and
indicating means coupled to the outputs of the phase-sensitive rectifier circuits for indicating the senses of their output signal levels;
the magnitude of said first resistive element being adjustable until the phase difference between the unbalance signal at the input of said first rectifier circuit and the first reference signal supplied thereto is at a predetermined value,
said movable tap on said second variable resistance being subsequently adjustable until the phase difference between the signal at the input of said second rectifier circuit and said second reference signal supplied thereto is at a predetermined value, without affecting the phase relation between the signal at the input of the first rectifier circuit and the first a.c. reference signal to balance the bridge.

2. An a.c. bridge according to claim 1, in which the first and second resistive elements are arranged in parallel in the fourth arm.

3. An a.c. bridge according to claim 1, in which the resistance of the second resistive element is much larger than the reactance of the standard capacitor and the second resistive element and standard capacitor are arranged in parallel.

4. An a.c. bridge according to claim 1, 2 or 3 including means for coupling it to measuring means for determining the reactance of said unknown impedance.

5. An a.c. bridge according to claim 4, in which the measuring means is arranged to determine the resistive component of the unknown impedance.

6. An a.c. bridge according to claims 1 or 2, in which the fourth arm of the bridge is coupled to a source of a d.c. reference voltage to provide a d.c. current through the first and second resistive elements and the measuring means is a d.c. responsive voltmeter.

7. An a.c. bridge according to claim 1 or 2 in which the first a.c. reference signal is a voltage in quadrature with the boltage developed, in operation, across the unknown impedance and the first said resistance element is adjusted for minimum phase difference as indicated by a minimum value at the output of the first phase sensitive rectifier.

8. An a.c. bridge according to claim 7, in which the second a.c. reference signal is in-phase with the voltage developed, in operation, across the unknown impedance and the second resistive element is adjusted until the amplitude of the unbalance signal at the input of the second phase sensitive rectifier is at a minimum value as indicated by a minimum value at the output of the second phase sensitive rectifier.

9. An a.c. bridge according to claim 1 or 2 in which the first and second resistive elements are continuously variable elements and their d.c. resistance values are substantially equal to their a.c. resistance value at the operational frequencies of the a.c. bridge supply.

10. An a.c. bridge according to claim 1 or 2 in which the second resistive element is a potential divider coupled in parallel with the first resistive element and the phase-sensitive rectifiers are arranged with one of their inputs coupled to the variable resistance tap on the second resistive element.

11. An a.c. bridge according to claim 1 or 2 in which the standard reactance element is chosen to have a reactance which is equal to or less than the lowest resistance of the resistive circuit at the frequency of the a.c. bridge supply.

12. An a.c. bridge according to claim 1 or 2 in which the standard resistance is variable in decade steps to facilitate selection of an appropriate measuring range for the bridge.

13. An a.c. bridge according to claim 1 or 2 including means for disconnecting the resistive circuit from the bridge and substituting a resistor having a value substantially equal to the maximum value thereof while setting the value of the standard resistor to a selected value.

* * * * *